(12) United States Patent
Gordon et al.

(10) Patent No.: US 6,858,876 B2
(45) Date of Patent: Feb. 22, 2005

(54) SEMICONDUCTOR DIODE DEVICE

(75) Inventors: Neil Thomson Gordon, Malvern (GB); Anthony Michael White, Malvern (GB); Charles Thomas Elliott, Malvern (GB)

(73) Assignee: QinetiQ Limited, Hants (GB)

( * ) Notice: Subject to any disclaimer, the term of this patent is extended or adjusted under 35 U.S.C. 154(b) by 0 days.

(21) Appl. No.: 10/450,310

(22) PCT Filed: Dec. 10, 2001

(86) PCT No.: PCT/GB01/05454

§ 371 (c)(1),
(2), (4) Date: Jun. 11, 2003

(87) PCT Pub. No.: WO02/49117

PCT Pub. Date: Jun. 20, 2002

(65) Prior Publication Data

US 2004/0036093 A1 Feb. 26, 2004

(30) Foreign Application Priority Data

Dec. 12, 2000 (GB) .............................. 0030204

(51) Int. Cl.$^7$ ............................................... H01L 33/00
(52) U.S. Cl. .............................. 257/96; 257/80; 257/87; 257/101
(58) Field of Search .............................. 257/96, 80, 87, 257/101

(56) References Cited

U.S. PATENT DOCUMENTS 4,292,512 A * 9/1981 Miller et al. ................ 250/205
4,544,938 A  10/1985 Scholl ......................... 257/435
5,654,578 A * 8/1997 Watanabe .................... 257/438
5,757,025 A * 5/1998 Ahn ............................. 257/21
6,133,590 A * 10/2000 Ashley et al. ............... 257/106

FOREIGN PATENT DOCUMENTS

| EP | 0 109 855 | 5/1984 |
| EP | 0 325 532 | 7/1989 |
| GB | 2085655 | 4/1982 |
| JP | 56125877 | 10/1981 |
| JP | 60074480 | 4/1985 |
| WO | WO 97/13278 | 4/1997 |

OTHER PUBLICATIONS

Benjaminsen, et al. "Auger Suppression in a Noise Performance of HOT HgCdTe IR Detectors", *Mat. Res. Soc. Symp. Proc.* vol. 607 pp. 205–211 (2000).

* cited by examiner

*Primary Examiner*—David Nelms
*Assistant Examiner*—Tu-Tu Ho
(74) *Attorney, Agent, or Firm*—McDonnell Boehnen Hulbert & Berghoff LLP

(57) ABSTRACT

A multi-layer semiconductor diode having a layer of wide bandgap material located between the active layer and a first contact zone, where the active layer and additional wide bandgap layer are of one dopant type, and the first contact zone is of the opposite dopant type. A specific embodiment of the invention comprises a stack formed from a first contact zone (4) of p-type material, a lightly doped p-type active layer (2), an additional p layer (20) and a second contact zone (6) of n-type material. The diode may be used as an infrared detector or a negative luminescent source.

18 Claims, 2 Drawing Sheets

SEMICONDUCTOR DIODE DEVICE

This invention relates to a semiconductor diode device, and in particular to a reduced noise and reduced dark current Auger suppressed semiconductor diode structure for use as an infrared detector or as a negative luminescent source.

Narrow gap semiconductor photon detectors are well known in the prior art. At room temperature a standard narrow gap semiconductor has a certain concentration of intrinsic carriers. These intrinsic carriers will mask low dopant concentrations and thus high dopant levels have to be used to permit operation in the extrinsic regime, where the doping concentrations are greater than the intrinsic charge carrier concentrations. A consequence of a high carrier density is a high thermal generation rate, which leads to high dark leakage currents. To obtain operation in the extrinsic regime, but with an acceptable level of leakage current, these devices are generally cooled.

One application of semiconductor detectors is to detect photons received from a thermal scene, and the detection of wavelengths within the 3–5 $\mu$m and 8–12 $\mu$m atmospheric windows are thus of particular interest. An array of such infrared detector elements may be used to make a thermal imaging device. For a typical narrow gap semiconductor material, Cadmium Mercury Telluride (CMT), it is common practice when operating in the 3–5 $\mu$m and 8–12 $\mu$m wavelength windows to cool the device to at least 200K and 80K respectively.

Operation of narrow gap devices at ambient temperatures has also been obtained using a process of Auger suppression, see EP0167305. Auger suppression reduces the carrier concentrations by electronic means so that extrinsic behaviour with low doping levels is observed, even at ambient temperature.

The Auger suppressed devices described in EP0167305 consists of a low doped layer sandwiched between two contacting zones. The low doped layer has a band gap such that it is sensitive to a required wavelength of light and is termed the active zone (i.e. it is the photosensitive zone). The two contacting zones generally have higher band-gaps which makes them substantially insensitive to the incident radiation and also reduces leakage current from the thermal generation processes that occur more readily in lower band gap materials.

The first contact zone can have high doping concentrations of the same type as the active zone, a higher bandgap with the same dopant level and type as the active zone or some combination of both of these features. The important feature of the first contact zone is that the minority carrier concentration must be low so that under reverse bias carriers are removed from the active zone without replenishment from the first contact zone. Interfaces of this type are termed excluding interfaces.

The second contact zone has doping of the opposite type to that present in the active zone, thereby forming a p-n (or n-p) junction. The second contact zone must again have as low a minority carrier concentration as possible so that under reverse bias minority carriers are captured at the interface and cannot return because of the usual barrier which exists in a reversed bias junction. This type of interface is called an extracting interface.

The thickness of the active layer in the device described in EP0167305 is usually chosen to be about the optical absorption length and is generally less than the diffusion length of the minority carriers in the active zone. For p-type material 5 $\mu$m might be a typical value, and for n-type material this would be in the region of 2 $\mu$m. The first and second contact zones should ideally be several microns thick to minimise the in-diffusion of minority carriers from the electrical contacts used to apply the electrical bias.

The overall effect of the Auger suppression device is that minority carriers are removed at the extracting interface and are not re-supplied at the excluding contact. Although the original concentration of minority carriers is large (near the intrinsic concentration) the application of a reverse bias can significantly reduce this. The removal of the vast majority of minority carriers is accompanied by the loss of a corresponding number of majority carriers to preserve space charge balance. This leaves a very small concentration of minority carriers, and a concentration of majority carriers close to the ionised doping concentration in the active zone.

It should also be noted, as described in more detail in Appl. Phys. Lett., Vol. 79, No. 8, Aug. 20, 2001, that exclusion and extraction of majority and minority carriers from the active region in reverse biased infra-red diode devices can be used to provide negative luminescence. Such devices appear colder than they actually are because electron and hole concentrations are reduced to levels below their thermal equilibrium values; this suppresses radiative recombination thereby making the device a net absorber of radiation.

Although thermal generation rates are greatly reduced in the Auger suppressed device of EP0167305, a residual leakage current is still present. The leakage current arises from many sources, such as residual thermal and optical generation in the active zone. This contribution to the leakage current can be reduced by meeting the doping requirements described above, but this can be technically challenging near the extraction and exclusion interfaces.

At the extracting interface there can be current leakage because the minority carrier concentration is not low enough. If the change in doping levels at the interface is significantly graded, there will be a region close to the junction of low doping concentration, and hence relatively high minority carrier concentration. Thermal generation thus leads to leakage current in the normal manner of an imperfect diode. Similarly, at the excluding interface there may be a graded interface with a short region of low doping and low bandgap which does not meet the ideal specification, leading to unwanted carrier generation and leakage.

Debye-screened spill over from highly doped regions into low doped regions effectively grades even the sharpest of metallurgical interfaces, and produces minority carrier generation in the tail of such a graded interface. Additionally, co-located rapid changes of doping and bandgap can give rise to temporary interruptions in the otherwise regular switches in the level of the band edges (termed "glitches") and may impede the proper flow of current in the device.

The spill-over, doping tail and doping gradient problems of the Auger suppresse device of EP0167305 are substantially overcome by the improved Auger suppressed device of WO97/13278.

The improved Auger suppressed device of WO97/13278 is similar to the device of EP0167305, with the important exception that the first contact zone and the second contact zone both comprise two separate layers. The two layers within each contact zone have dopant levels and band-gaps such that two excluding interfaces and two extracting interfaces are formed.

A typical embodiment of an improved Auger suppressed device of WO97/13278 (see FIG. 1 herein) comprises a layer of heavily doped p-type material (layer 8), a first buffer layer of lightly doped p-type material (layer 10), an active layer of lightly doped p-type material (layer 2), a second buffer layer of lightly doped n-type material (layer 14) and a layer of heavily doped n-type material (layer 12). On application of a reverse bias excluding interfaces are formed between layers 8 and 10, and between layers 10 and 2. Extracting interfaces are formed between layers 2 and 14, and between layers 14 and 12.

The provision of high efficiency dual layer contact zones substantially reduces the leakage currents associated with the excluding and extracting interfaces. However, a leakage current is still present because of other depletion region effects such as generation, surface effects, tunnelling and impact ionisation.

Generation in the depletion region can be very much greater than in the bulk of the material. This generation occurs mainly from traps (localised states with energies near the middle of the band gap arising from impurities in the semiconductor material) in the depletion region, and is higher in smaller band gap material and at higher temperatures.

Discontinuous surfaces can result in a large density of interface states and will generate minority carriers by the Shockley-Read-Hall mechanism. Charged surfaces will also cause the depletion region to extend further into, depending on the sign of the charge, the p-type side or n-type side of the junction. Increased tunnelling effects, or extension of the depletion region along the surface, may then occur.

Under reverse bias, direct band to band tunnelling is possible from filled states in the valence band to empty states at the same energy in the conduction band. Tunnelling increases with dopant concentration and decreases as the band gap widens. Trap-assisted tunnelling effects may also occur. As an electron or hole crosses the depletion region, it is accelerated by the electric field and can reach an energy greater than the band gap. This energetic carrier can loose some of its energy by promoting an electron from the valence band to the conduction band, producing an electron hole pair. This impact ionisation effectively multiplies the currents produced by the other processes.

Low frequency (1/f) noise is also observed in narrow bandgap semiconductor devices. The exact mechanism responsible for such noise has not yet been firmly established, but it has been observed empirically that there is less 1/f noise associated with shorter wavelength, wider band gap, devices.

A more complete review of leakage mechanisms associated with semiconductor photon detectors can be found in chapter 10 of "The handbook on semiconductors" edited by C. Hilsum (1993, Elsevier Science Publishers B. V., 4$^{th}$ Edition).

According to this invention a semiconductor diode comprises a first contact zone, an active layer and a second contact zone; the first contact zone being doped with the opposite dopant type than that of the active layer, the second contact zone being doped with the same dopant type as the active layer, the first contact zone, the active layer and the second contact zone being arranged in a stack such that the active layer is located between the first contact zone and the second contact zone wherein the semiconductor diode structure further comprises an additional layer which is doped with the same dopant type as the active layer and which has a wider bandgap than the active layer and wherein the additional layer is located between the active layer and the first contact zone.

The introduction of the additional layer causes the p-n junction to be formed from a material that has a wider bandgap than the active layer. As described below, the leakage current and 1/f noise generated by the junction are therefore reduced. The inclusion of the additional layer also improves the breakdown voltage characteristics of the device.

Preferably on application of a reverse bias voltage, at least one excluding interface is formed between the active layer and the second contact zone. At least one extracting interface may also be formed between the active layer and the first contact zone. This provides Auger suppression as described above.

In a further preferred embodiment, the second contact zone of the semiconductor diode consists of a heavily doped layer and a buffer layer of lightly doped material, the heavily doped layer and buffer layer being doped with the same dopant type, the heavily doped layer being located furthest from the active layer and the arrangement being such that two excluding interfaces are formed between the active layer and the buffer layer of lightly doped material and between the buffer layer of lightly doped material and the heavily doped layer.

Preferably the doping concentration of a buffer layer of lightly doped material of the second contact zone is substantially similar to the doping concentration of the additional layer.

Furthermore, the semiconductor may have a first contact zone which consists of a heavily doped layer and a buffer layer of lightly doped material, the heavily doped layer and buffer layer being doped with the same dopant type, the heavily doped layer being located furthest from the active layer, and the arrangement being such that two extracting interfaces are formed between the active layer and the buffer layer of lightly doped material and between the buffer layer of lightly doped material and the heavily doped layer.

Advantageously, the doping concentration in the heavily doped layer of the first contact zone and/or the second contact zone is greater than $2\times10^{17}$ cm$^{-3}$, whilst the doping concentration in the active layer is less than $5\times10^{16}$ cm$^{-3}$.

The use of contact zones that comprise a heavily doped layer and a buffer layer of lightly doped material improves the Auger suppression effect as described above.

It is preferred that the additional layer produces a bump in the conduction band the energy of which is less than the energy of the second contact zone conduction band. A preferred way of achieving this is for the additional layer to have a band gap lower than that of the second contact zone layer. Furthermore, the band gap and layer thickness of the additional layer can be designed so as to produce a bump in the conduction band which has no substantial effect on the quantum efficiency of the detector but provides a significant reduction in the dark leakage current at a predetermined temperature, such as within the range 220K to 300K. This temperature range is readily attainable using electrical cooling methods.

In one preferred embodiment, the semiconductor of the first contact zone comprises n-type material, the active layer is a p-type material, the additional layer is a p-type material and the second contact zone comprises p-type material. Alternatively, the first contact zone comprises p-type material, the additional layer is an n-type material, the active layer is an n-type material and the second contact zone comprises n-type material.

Conveniently, a semiconductor diode according to the present invention can be used in a detector for detecting infrared radiation. In particular, a device can be provided for detecting infra-red radiation in the wavelength ranges of 3–5 µm or 8–12 µm.

In a further embodiment, the present invention can provide a negative luminescent device; this may be employed in a variety of applications, for example as a thermal radiation shield in a IR detector or as an IR source. In addition, it would be recognised by those skilled in the art that the diode of the present invention can be operated under forward bias as a light emitting diode.

Throughout this specification, the terms "excluding" and "extracting", when applied to interfaces between layers in a device, indicate the nature of the interface with respect to the active layer of the device. Moreover, although in the specific embodiments presented above a p-type active layer is shown (which is also signified by the symbol π) this should not be seen as limiting. The invention is equally applicable to devices with an n-type active layer wherein the roles of the other n-type and p-type layer would be reversed with respect to the example given.

Throughout this specification, a subscript bar (_) is taken to mean a material with a wider bandgap than that of the active layer. Additionally, "n" or "p" in conjunction with a superscript "+" symbol indicates a high level of n or p type doping, as would be well understood by a person skilled in the art.

The invention will now be described with reference to the accompanying drawing in which.

Figure 1:
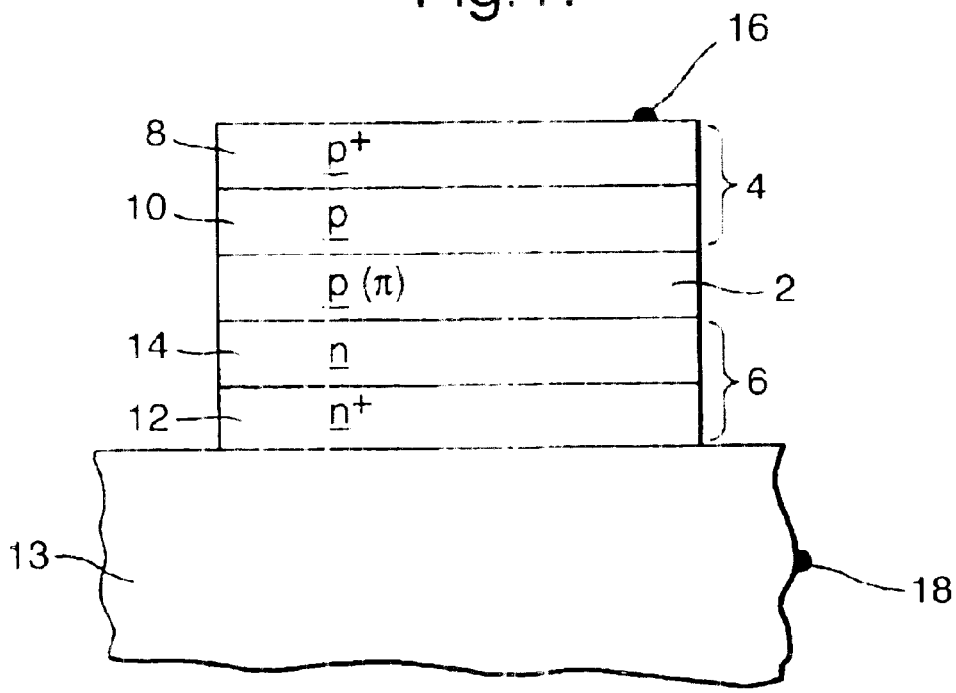
FIG. 1 is a schematic drawing of a known Auger suppressed semiconductor photo-detector device.

Referring to FIG. 1, an Auger suppressed device of the type described in the prior art comprises a multilayer structure having a lightly doped p-type active layer (2) sandwiched between a first contact zone (4) and a second contact zone (6). In the example shown, the first contact zone comprises an outermost $p^+$ layer (8) and an inner $p$ layer (10) and the second contact zone comprises an outermost $n^+$ layer (12) and an inner $n$ layer (14).

The bandgap of the active zone (2) is determined by the wavelength of radiation that is to be detected, whilst the first contact zone (4) and second contact zone (6) have bandgaps higher than the active zone (2).

On application of a reverse bias, exclusion is obtained at the interface between the outermost $p^+$ layer (8) and the inner $p$ layer (10) and at the interface between the inner $p$ layer (10) and the active p layer (2). Extraction is obtained at the interface between the active layer (2) and the inner $n$ layer (14) and also at the interface between the inner $n$ layer (14) and the outermost $n^+$ layer (12).

The layer structure is grown on a suitable substrate (13) by standard deposition techniques, such as vapour deposition, which are well known to those skilled in the art. Many types of suitable semiconductor materials are well known to persons skilled in the art such as, by way of example only, Cadmium Mercury Telluride (CMT). Electrical connection is made to the semiconductor device via electrodes (16 and 18) that a person skilled in the art would recognise as suitable for the particular type of material used. A person skilled in the art would also recognise that although the outermost $n^+$ layer (12) is shown in FIG. 1 to be in contact with the substrate (13), the structure could equally be grown with the outermost $p^+$ layer (8) in contact with the substrate (13).

As described in the prior art, the efficiency of the extraction and exclusion processes in such Auger suppressed devices can be readily optimised by controlling the grading of material band-gap and dopant concentration at the various interfaces. Although the use of dual layer contact zones is not essential, it significantly reduces the spill-over and doping tail problems that are encountered with single layer contact zone devices.

Figure 2:
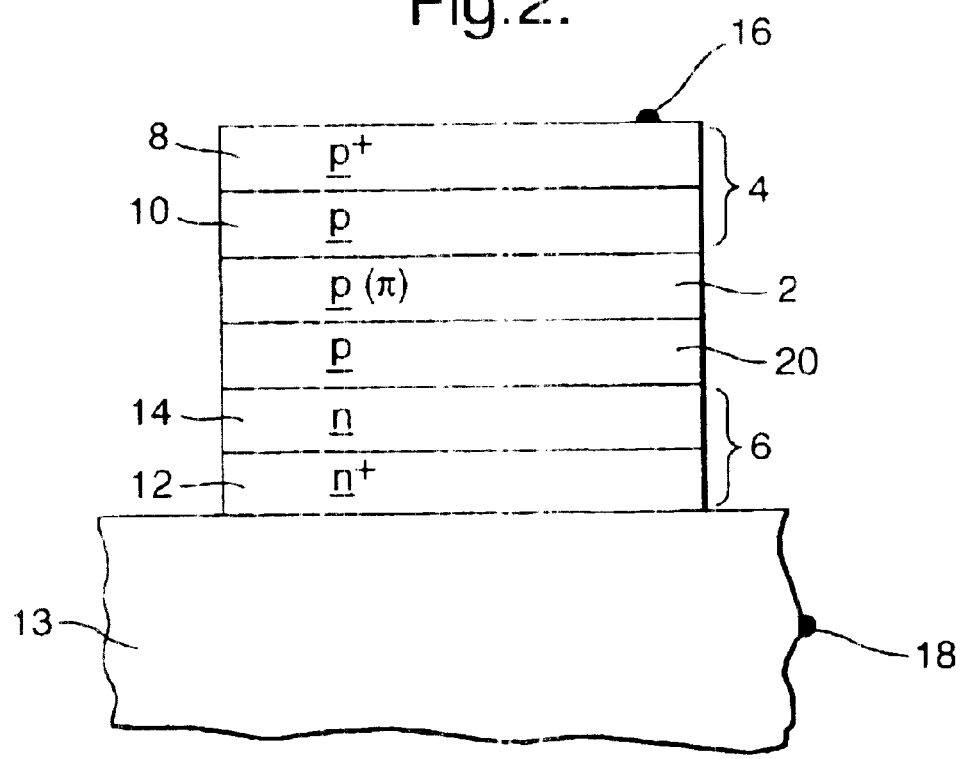
FIG. 2 is a schematic drawing of an improved semiconductor photo-detector device according to this invention.

Referring to FIG. 2, an improved Auger suppressed device according to the present invention comprises, in common with the prior art, a multilayer structure having a lightly doped p-type active layer (2) sandwiched between a first contact zone (4) and a second contact zone (6). Again in the example shown, the first contact zone comprises an outermost $p^+$ layer (8) and an inner $p$ layer (10) and the second contact zone comprises an outermost $n^+$ layer (12) and an inner $n$ layer (14). However, the device according to the present invention also comprises a additional $p$ layer (20).

Although the additional $p$ layer (20) must be of the same dopant type as the active layer, it may be more heavily doped than the active layer (whereupon it should more properly be denoted as a $p^+$ layer). If the dopant concentration of the additional $p$ layer is significantly greater than that of the active layer, it may also be necessary to grade the dopant concentration across the additional $p$ layer to prevent doping tail problems at the interface between the active layer and the additional $p$ layer. The relative dopant levels in the active and additional $p$ layer that would require such a graded dopant concentration would vary for different semiconductor materials, but would be immediately apparent to a person skilled in the art.

The depletion region, which exists between the p-type and n-type regions of a diode, can act as a source of leakage current. Depletion region generated currents were first studied by Shockley et al and have a characteristic variation with energy gap and temperature, well known to those skilled in the art, that is given by:

$$I_{depletion} = I_o \exp\left(-\frac{qE_g}{nkT}\right) \tag{1}$$

where $E_g$ is the band gap, T is the sample temperature and n is a constant typically between 1 and 2.

As described above, there are a number of other mechanisms which generate excess dark currents at junctions. These include band to band tunnelling, trap assisted tunnelling and surface tunnelling. In all these cases, the junction generated currents decrease rapidly with increasing band gap in the depletion region. The amount of 1/f noise has also been found empirically to decrease as the band gap in the depletion region in widened. Hence, both the leakage current and 1/f noise can be reduced by increasing the band gap at the p-n junction.

Infrared detectors described in the prior art have a band gap which is determined by the need to detect radiation at the correct wavelengths. However in a device constructed according to this invention, a junction is formed between wide band gap materials; the additional $p$ layer (20) and the inner $n$ layer (14). The lower band gap material needed to detect the radiation, the active layer (2), is sandwiched between the additional layer (20) and the inner $p$ layer (10).

The present invention proves highly advantageous when applied to Auger suppressed devices, of the type described herein, that have extraction and exclusions interfaces. However, the invention can be used to reduce the leakage current at a p-n (or n-p) junction in any type of diode structure.

Figure 3:
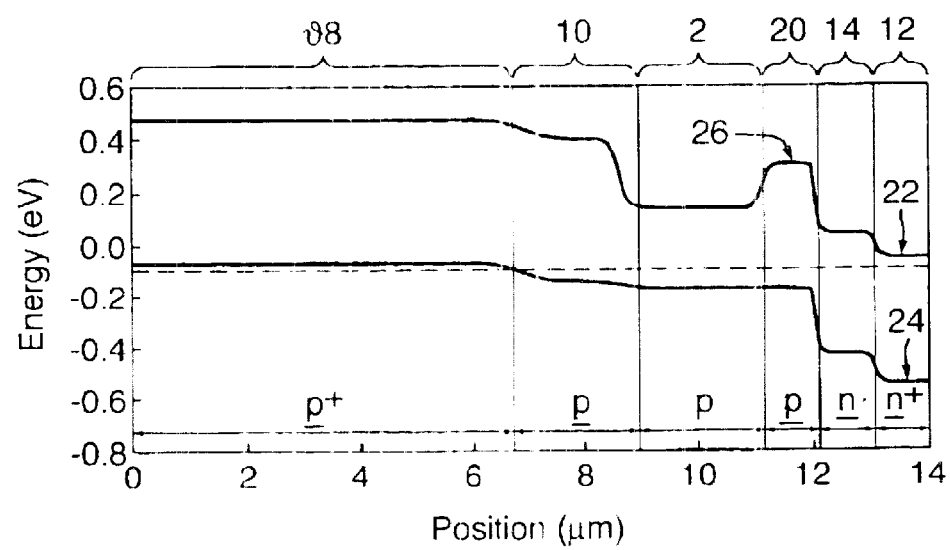
FIG. 3 is a diagram of the band structure, under reverse bias, of an improved semiconductor photo-detector device according to this invention.

Referring to FIG. 3, the conduction band (22) and valence band (24) energies of a typical device of the present invention are given. The device of FIG. 3 comprises an outermost p⁺ layer (8), an inner p layer (10), an active layer (2), an additional p layer (20), an inner n layer (14) and an outermost n⁺ layer (12).

It can be seen from FIG. 3 that moving the junction into the wide band gap part of the structure produces a bump in the conduction band (26). It would generally be accepted in the art of semiconductor device design that such bumps will confine carriers and, in the case of detectors, reduce the net quantum efficiency. Electrons generated in the active layer (2) will have to cross the bump to be detected. Normally, infrared detectors are operated at 77K in which case, a large bump in the conduction band will kill the photo-response of the device. At higher operating temperatures however the higher thermal energy of the electrons will enable more carriers to cross the bump.

The efficiency at which electrons are extracted over the bump can be estimated by comparing the diffusion time over the bump with the lifetime in the active layer.

$$\eta_{ext} = \frac{1}{\frac{w_b w_{act}}{\tau D}\exp\left(\frac{qE_b}{kT}\right)+1} \quad (2)$$

where $w_b$, $w_{act}$ are the widths of the barrier and active layers, $E_b$ is the barrier height, $\sigma$ is the lifetime in the carrier region and D is the diffusion constant. In equation (2) it is assumed that the carrier diffusion length is larger than the layer widths $w_b$ and $w_{act}$. It is also assumed that surface recombination is insignificant at the interface of the active layer (2) and the inner p layer (10), i.e. the energy of the conduction band barrier at the interface of the active layer (2) and the inner p layer (10) is greater than the energy of the bump in the conduction band.

Equation 2 can be used to estimate the maximum barrier height possible for example by calculating the barrier height at which the extraction efficiency drops by 10%. Equation (1) or similar can then be used to calculate the reduction in the junction generated currents which can be achieved.

Following equation (2) it can be seen that as the temperature is reduced, the extraction efficiency across the barrier also reduces. A reduced temperature also reduces the leakage current associated with the depletion region according to equation (1). The barrier height (i.e. bandgap) and width of the additional layer (20) can be thus be varied to achieve optimum device performance at any temperature; such as room temperature (approximately 290K) or a temperature which can be readily attained through simple electrical cooling techniques (circa 240K).

Variation of the bandgap and the thickness of the additional layer (20) can be readily controlled using CMT material. However if other materials are used, such as Indium Aluminium Antimonide (InAlSb), additional factors such as lattice matching considerations may limit the maximum thickness of the additional layer (20) and the energy gap difference. Such material constraints are well known to those skilled in the art.

To ensure efficient electron extraction over the bump in the conduction band that is caused by the additional layer (20), the bandgap of the additional layer (20) should be slightly lower than that of the inner p layer (10). This ensures that the energy of the bump in the conduction band is less than the energy of the conduction band of the inner p layer (10).

In addition to a reduction in dark currents from the junction, the present invention also reduces low frequency (or 1/f) noise in infrared photo-diodes. The low frequency noise is found to vary with band gap as shown in equation (1). Increasing the band gap at the junction will therefore reduce the 1/f noise component which is generated at the junction. Reducing low frequency noise may be relevant to types of devices other than infrared detectors, for example Gallium Arsenide (GaAs) mixer diodes.

The present invention thus provides a device which is suitable for incorporation by hybridization, growth in situ or otherwise in a variety of electronic devices, such as a hybridised detector.

Table 1 shows the structure and doping concentrations of a typical device of the invention. The material of each layer of the device is of the family $Hg_{(1-x)}Cd_xTe$ and is specified by the value of x. In this table, p and n indicate the type of doping in the CMT material.

TABLE 1

A typical device of the current invention

| Layer Thickness (10⁻⁶ m) | X | Type | Doping concentration |
|---|---|---|---|
| 1.6 | 0.480 | N | 4.0 × 10¹⁷ I |
| 1.0 | 0.480 | N | 5.0 × 10¹⁵ I |
| 2.0 | 0.420 | P | 4.0 × 10¹⁵ As |
| 2.5 | 0.320 | p (π) | 2.0 × 10¹⁵ As |
| 2.0 | 0.480 | P | 4.0 × 10¹⁵ As |
| 7.0 | 0.480 | P | 3.0 × 10¹⁷ As |

Although the example shown in table 1 uses Cadmium Mercury Telluride (CMT) semiconductor material, a person skilled in the art would immediately recognise that the invention is applicable to all types of semiconductor material. A person skilled in the art would also recognise that the invention is equally applicable to devices with an n-type active layer wherein the roles of the other n-type and p-type layer would be reversed with respect to this example.

EXAMPLE

A photo-diode according to the present invention has been fabricated from Cadmium Mercury Telluride (CMT) semiconductor material. The layer structure of the device is given in table 2; the material of each layer of the device being of the family $Hg_{(1-x)}Cd_xTe$ and specified by the value of x.

TABLE 2

The structure of a device of the present invention

| Layer | Layer Thickness (μm) | X | Doping concentration (cm⁻³) |
|---|---|---|---|
| n⁺ contact layer | 1.00 | 0.400 | 4.00 × 10¹⁷ I |
| n⁻ spacer layer | 0.80 | 0.400 | 1.00 × 10¹⁶ I |
| p barrier layer | 1.50 | 0.330 | 1.50 × 10¹⁵ As |
| p active layer | 3.00 | 0.230 | 1.50 × 10¹⁵ As |
| p⁻ spacer layer | 2.00 | 0.420 | 4.00 × 10¹⁵ As |
| p⁺ contact layer | 7.00 | 0.420 | 3.00 × 10¹⁷ As |

Figure 4:
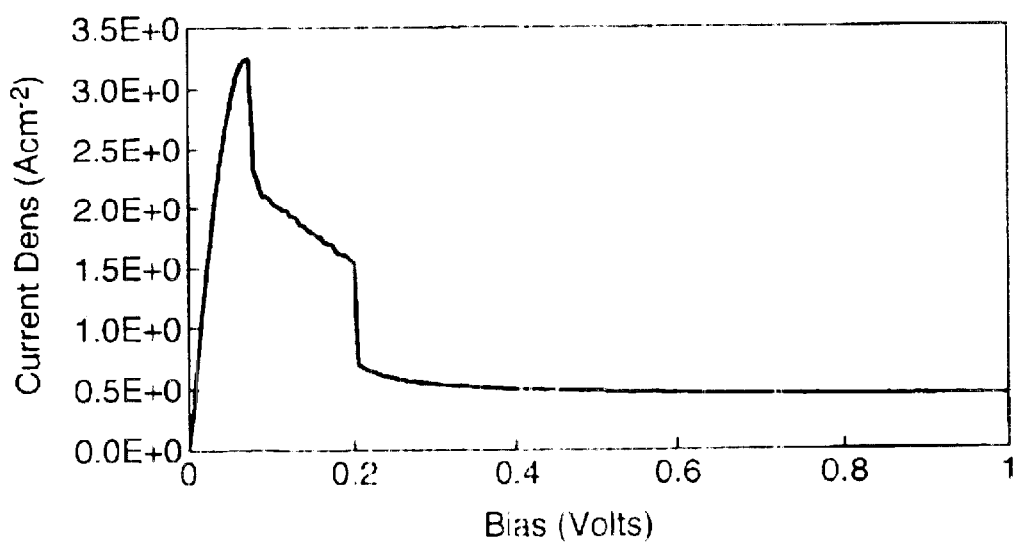
FIG. 4 is a graph showing the reverse bias properties of a diode according to the present invention.

Referring to FIG. 4, the measured room temperature current density vs reverse bias voltage characteristic are shown. It can be seen that there is no breakdown of the structure with reverse bias voltages of up to 1V applied. The diode can be employed as an infra-red detector. Also, the good reverse bias breakdown properties make the device suited for use as a negative luminescent source.

What is claimed is:

1. A semiconductor diode comprising;

a first contact zone;

an active layer;

a second contact zone;

the first contact zone being doped with the opposite dopant type than that of the active layer;

the second contact zone being doped with the same dopant type as the active layer;

the first contact zone, the active layer and the second contact zone being arranged in a stack such that the active layer is located between the first contact zone and the second contact zone;

wherein the semiconductor diode structure further comprises an additional layer which is doped with the same dopant type as the active layer and which has a wider bandgap than the active layer and, wherein the additional layer is located between the active layer and the first contact zone and wherein the additional layer has a band gap lower than that of the second contact zone.

2. A semiconductor diode structure as claimed in claim 1 where, on application of a reverse bias voltage, at least one excluding interface is formed between the active layer and the second contact zone.

3. A semiconductor diode structure as claimed in claim 1 where, on application of a reverse bias voltage, at least one extracting interface is formed between the active layer and the first contact zone.

4. A semiconductor diode as claimed in claim 1 wherein the second contact zone consists of;

a heavily doped layer and a buffer layer of lightly doped material;

the heavily doped layer and buffer layer being doped with the same dopant type, the heavily doped layer being located furthest from the active layer, and the arrangement being such that two excluding interfaces are formed between the active layer and the buffer layer of lightly doped material and between the buffer layer of lightly doped material and the heavily doped layer.

5. A semiconductor diode comprising; a first contact zone; an active layer; a second contact zone; the first contact zone being doped with the opposite dopant type than that of the active layer; the second contact zone being doped with the same dopant type as the active layer; the first contact zone, the active layer and the second contact zone being arranged in a stack such that the active layer is located between the first contact zone and the second contact zone; wherein the semiconductor diode structure further comprises an additional layer which is doped with the same dopant type as the active layer and which has a wider bandgap than the active layer, wherein the additional layer is located between the active layer and the first contact zone, wherein the second contact zone consists of; a heavily doped layer and a buffer layer of lightly doped material; the heavily doped layer and buffer layer being doped with the same dopant type, the heavily doped layer being located furthest from the active layer, and the arrangement being such that two excluding interfaces are formed between the active layer and the buffer layer of lightly doped material and between the buffer layer of lightly doped material and the heavily doped layer wherein the doping concentration of the buffer layer of lightly doped material of the second contact zone is substantially similar to the doping concentration of the additional layer.

6. A semiconductor diode as claimed in claim 1 wherein the first contact zone consists of;

a heavily doped layer and a buffer layer of lightly doped material;

the heavily doped layer and buffer layer being doped with the same dopant type, the heavily doped layer being located furthest from the active layer, and the arrangement being such that two extracting interfaces are formed between the active layer and the buffer layer of lightly doped material and between the buffer layer of lightly doped material and the heavily doped layer.

7. The semiconductor diode as claimed in claim 6 wherein the doping concentration in the heavily doped layer of the first contact zone is greater than $2 \times 10^{17}$ cm$^{-3}$.

8. The semiconductor diode as claimed in claim 4 wherein the doping concentration in the heavily doped layer of the second contact zone is greater than $2 \times 10^{17}$ cm$^{-3}$.

9. The semiconductor diode as claimed in any of the preceding claims wherein the doping concentration in the active layer is less than $5 \times 10^{16}$ cm$^{-3}$.

10. A semiconductor diode as claimed in claim 1 wherein the additional layer produces a bump in the conduction band the energy of which is less than the energy of the second contact zone conduction band.

11. A semiconductor diode as claimed in claim 1 wherein the band gap and layer thickness of the additional layer produces a bump in the conduction band which has no substantial effect on the quantum efficiency of the detector and provides a significant reduction in the dark leakage current at a predetermined temperature.

12. A semiconductor diode as claimed in claim 11 wherein the predetermined temperature is within the range of 220K to 300K.

13. A semiconductor diode as claimed in claim 1 wherein the first contact zone comprises n-type material, the active layer is a p-type material, the additional layer is a p-type material and the second contact zone comprises p-type material.

14. A semiconductor diode as claimed in any of claim 1 wherein the first contact zone comprises p-type material, the additional layer is an n-type material, the active layer is an n-type material and the second contact zone comprises n-type material.

15. A device for detecting infrared radiation comprising a semiconductor diode as claimed in claim 1.

16. A device as claimed in claim 15 for operation in the wavelength range of 3–5 μm.

17. A device as claimed in claim 15 for operation in the wavelength range of 8–12 μm.

18. A negative luminescent device comprising a semiconductor diode as claimed in of claim 1.

* * * * *